(12) United States Patent
Nishioka et al.

(10) Patent No.: US 7,858,880 B2
(45) Date of Patent: Dec. 28, 2010

(54) CONDUCTIVE TERMINAL WELDING METHOD AND CONDUCTIVE TERMINAL STRUCTURE

(75) Inventors: Akihiko Nishioka, Kasugai (JP); Takeshi Yasuda, Nagoya (JP)

(73) Assignee: OMRON Corporation, Kyoto (JP)

( * ) Notice: Subject to any disclaimer, the term of this patent is extended or adjusted under 35 U.S.C. 154(b) by 673 days.

(21) Appl. No.: 11/927,027

(22) Filed: Oct. 29, 2007

(65) Prior Publication Data

US 2008/0102716 A1    May 1, 2008

(30) Foreign Application Priority Data

Oct. 30, 2006    (JP)    .............................. 2006-293682

(51) Int. Cl.
*H02G 5/00* (2006.01)
*H01R 4/02* (2006.01)
*B23K 11/18* (2006.01)

(52) U.S. Cl. ................. 174/70 B; 174/71 B; 174/72 B; 174/88 B; 439/887; 439/551; 219/118

(58) Field of Classification Search ............... 174/70 B, 174/71 B, 88 B, 72 B, 263, 73.1, 74 R; 439/76.1, 439/76.2, 949, 969, 212, 887, 884; 29/592, 29/592.1; 219/50, 78.1, 83, 91.2, 118, 93

See application file for complete search history.

(56) References Cited

U.S. PATENT DOCUMENTS 2,498,343 A    2/1950    Rider (Continued)

FOREIGN PATENT DOCUMENTS

EP    0332551    9/1989

(Continued)

OTHER PUBLICATIONS

Patent Abstracts of Japan, Publication No. 2002-281644, Publication Date: Sep. 27, 2002, 1 page.

(Continued)

*Primary Examiner*—Angel R Estrada
(74) *Attorney, Agent, or Firm*—Osha Liang LLP

(57) ABSTRACT

The invention provides a welding method by resistance welding capable of adequately increasing a welding strength between two conductive terminals each made of copper, and a conductive terminal structure obtained by the method. A first conductive terminal made of a tinned flat copper plate is molded such that a step portion is formed at a position spaced away from a tip end position of the first conductive terminal and a projection is formed at a tip end portion ranging from the tip end position to the step portion. A second conductive terminal made of the aforementioned copper plate and the first conductive terminal are molded such that a weld surface of the second conductive terminal has a size to cover an entire weld surface of the projection of the first conductive terminal. Simultaneously, the respective conductive terminals are molded such that the tip end portion of the first conductive terminal becomes substantially equal in sectional area to a weld portion of the second conductive terminal. These conductive terminals are brought into contact under pressure with electrodes equal in electrical characteristic to each other, and then electric current is fed to the electrodes. Thus, the projection of the first conductive terminal is melted into and is welded to the weld surface of the second conductive terminal.

10 Claims, 8 Drawing Sheets

U.S. PATENT DOCUMENTS

| | | |
|---|---|---|
| 2,554,464 A | 5/1951 | Kraus |
| 3,118,049 A * | 1/1964 | Gros et al. .................... 219/93 |
| 3,592,993 A * | 7/1971 | Bennett ....................... 219/83 |
| 3,805,014 A * | 4/1974 | Becker ........................ 219/93 |
| 4,981,241 A | 1/1991 | Keller |
| 5,009,885 A | 4/1991 | Yarborough |
| 5,037,639 A | 8/1991 | Tung |
| 5,224,628 A | 7/1993 | Keller |
| 5,268,167 A | 12/1993 | Tung |
| 5,411,180 A | 5/1995 | Dumelle |
| 5,437,857 A | 8/1995 | Tung |
| 5,460,803 A | 10/1995 | Tung |
| 5,534,244 A | 7/1996 | Tung |
| 5,648,064 A | 7/1997 | Gaffar |
| 5,770,105 A | 6/1998 | Fischer |
| 5,819,988 A | 10/1998 | Sawhney |
| 5,858,332 A | 1/1999 | Jensen |
| 5,922,307 A | 7/1999 | Montgomery |
| 5,928,628 A | 7/1999 | Pellico |
| 5,975,906 A | 11/1999 | Knutson |
| 6,000,341 A | 12/1999 | Tung |
| 6,036,493 A | 3/2000 | Sharma |
| 6,056,930 A | 5/2000 | Tung |
| 6,065,645 A | 5/2000 | Sawhney |
| 6,155,832 A | 12/2000 | Wiesel |
| 6,162,055 A | 12/2000 | Montgomery et al. |
| 6,213,671 B1 | 4/2001 | Chang |
| 6,254,857 B1 | 7/2001 | Hoic |
| 6,287,120 B1 | 9/2001 | Wiesel |
| 6,312,670 B1 | 11/2001 | Montgomery |
| 6,322,773 B1 | 11/2001 | Montgomery |
| 6,325,640 B1 * | 12/2001 | Kasai ....................... 174/71 B |
| 6,331,292 B1 | 12/2001 | Montgomery |
| 6,368,576 B1 | 4/2002 | Jensen et al. |
| 6,416,319 B1 | 7/2002 | Cipolla |
| 6,458,340 B1 | 10/2002 | Ibsen et al. |
| 6,488,914 B2 | 12/2002 | Montgomery |
| 6,514,543 B2 | 2/2003 | Montgomery |
| 6,533,582 B2 | 3/2003 | Lindquist |
| 6,536,628 B2 | 3/2003 | Montgomery |
| 6,655,968 B2 | 12/2003 | Kasai |
| 6,949,240 B2 | 9/2005 | Sagel et al. |
| 6,958,144 B2 | 10/2005 | Montgomery |
| 6,997,737 B2 * | 2/2006 | Hiwatashi .................... 439/949 |
| 2002/0137001 A1 | 9/2002 | Cipolla et al. |
| 2002/0141951 A1 | 10/2002 | Montgomery |
| 2003/0089886 A1 | 5/2003 | Montgomery |
| 2003/0198605 A1 | 10/2003 | Montgomery |
| 2004/0101497 A1 | 5/2004 | Montgomery |
| 2004/0247534 A1 | 12/2004 | Stoltz |
| 2005/0008584 A1 | 1/2005 | Montgomery |
| 2005/0084826 A1 | 4/2005 | Pilaro et al. |
| 2005/0249679 A1 | 11/2005 | Cameron et al. |
| 2005/0265933 A1 | 12/2005 | Montgomery et al. |

FOREIGN PATENT DOCUMENTS

| | | |
|---|---|---|
| EP | 0559262 | 9/1993 |
| EP | 0599435 | 11/1994 |
| EP | 1072323 | 1/2001 |
| EP | 1224925 | 7/2002 |
| JP | 5-283139 | 10/1993 |
| JP | 2002-95134 A | 3/2002 |
| JP | 2002-281644 A | 9/2002 |
| WO | WO 2005/110348 | 11/2005 |

OTHER PUBLICATIONS

Patent Abstracts of Japan, Publication No. 05-283139, Publication Date: Oct. 29, 1993, 1 page.

* cited by examiner

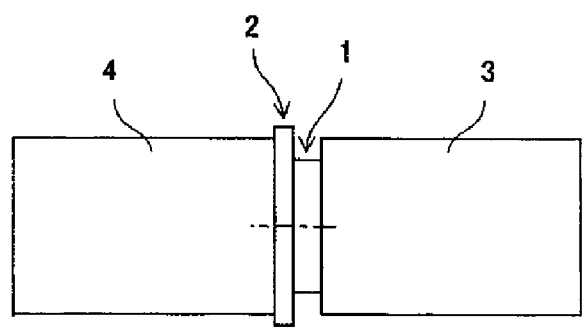
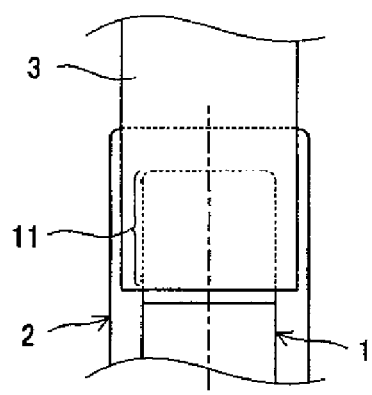
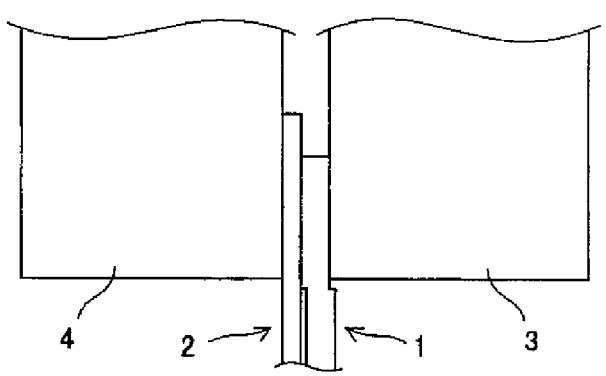

| (Strength) | | | | |
|---|---|---|---|---|
| Pressure: 16 kg | | | | |
| (Current/Voltage-Time) | 20ms | 30ms | 40ms | |
| 10A·10V | 13.7 | 13.79 | 15.94 | (kg) |

| (Melting amount) | | | | |
|---|---|---|---|---|
| Pressure: 16 kg | | | | |
| (Current/Voltage-Time) | 20ms | 30ms | 40ms | |
| 10A·10V | 0.11 | 0.1 | 0.11 | (mm) |

CONDUCTIVE TERMINAL WELDING METHOD AND CONDUCTIVE TERMINAL STRUCTURE

BACKGROUND OF THE INVENTION (1) Field of the Invention

The present invention relates to a method for welding conductive terminals each made of copper to each other by resistance welding, and a conductive terminal structure obtained by the method.

(2) Description of the Related Art

Typically, a resistance welding method has been used for welding conductive terminals in an electronic device to each other. An arc welding method and other welding methods are used rarely due to the following reason. That is, an amount of electric current to be fed in welding is too large; therefore, there is a possibility that an electronic component is damaged.

In resistance welding, when electric current is fed to components to be welded each of which is resistant to electricity in a state where the components come into contact with each other, the components are melted by heat generated owing to the electrical resistance.

As one example of the resistance welding method, there has been known a spot welding method (see FIG. 4 in JP2002-095134A and FIG. 2 in JP2002-281644A). This method involves a step of butting flat-shaped conductive terminals with each other, a step of bringing the conductive terminals into contact under pressure with electrodes each having a spherical or convex tip end such that the conductive terminals are sandwiched between the electrodes, and a step of feeding electric current to the electrodes. According to the spot welding method, a spot-shaped nugget (a melting portion) is formed at a contact portion between the conductive terminals. As another example of the resistance welding method, there has been also known a projection welding method (see FIG. 3 in JP2002-095134A and FIG. 1 in JP05(1993)-283139A). This method involves a step of butting a first conductive terminal including a spherical or convex projection against a second conductive terminal, a step of bringing the conductive terminals into contact under pressure with flat-shaped electrodes such that the conductive terminals are sandwiched between the electrodes, and a step of feeding electric current to the electrodes. According to the projection welding method, the projection itself forms a nugget.

According to the former spot welding method, conductive terminals each made of iron or the like can be readily welded to each other. According to the latter projection welding method, a projection itself forms a nugget; therefore, a melting state of a weld portion can be relatively stabilized.

In the spot welding method, however, conductive terminals each made of copper with considerably small resistivity, in particular, oxygen free copper with high purity are hardly welded to each other for the following reason. That is, copper effects less heat generation owing to electrical resistance and less melting by the heat; therefore, welding becomes difficult. Even when the surface of the conductive terminal made of copper is subjected to tin plating in order to ensure electrical resistance to some extent, it is difficult to form a nugget stably. As shown in FIG. 3 in JP2002-095134A and FIG. 1 in JP05 (1993)-283139A, in the conventional projection welding method, a center of a tip end portion of a conductive terminal is protruded to form a spherical or convex projection. Consequently, it is considerably difficult to enhance an accuracy of an amount of the projection which is melted into an opposite conductive terminal to form a nugget. Hence, the formation of the nugget becomes unstable and, also, a strength (a welding strength) of the nugget becomes unstable. As shown in FIG. 3 in JP2002-095134A, further, the projection is formed in such a manner that the center of the tip end portion of the conductive terminal is protruded. Therefore, it is difficult to spread an area of the projection. This causes problems that an adequate strength can not be ensured and an electric current capacity of the nugget is small. In the projection welding method, similarly, conductive terminals each made of copper with considerably small resistivity are hardly welded to each other for a reason that copper effects less heat generation owing to electrical resistance and less melting by the heat. Therefore, the welding of the conductive terminals becomes considerably difficult.

SUMMARY OF THE INVENTION

An object of the present invention is to provide a welding method by resistance welding capable of adequately increasing a welding strength between two conductive terminals each made of copper, and a conductive terminal structure obtained by the welding method.

The conductive terminal welding method according to the present invention is a method for welding first and second conductive terminals, each made of a tinned flat copper plate, to each other by projection welding.

The first conductive terminal is made of a tinned flat copper plate. Herein, a step portion is formed at a position spaced away from a tip end position of the first conductive terminal and a projection is formed at a tip end portion ranging from the tip end position to the step portion.

The second conductive terminal is also made of a tinned flat copper plate. Herein, a weld surface has a size to cover the entire tip end portion of the first conductive terminal and a weld portion has a sectional area substantially equal to a sectional area of the tip end portion of the first conductive terminal.

The first and second conductive terminals are brought into contact with each other.

Further, these conductive terminals are brought into contact under pressure with electrodes equal in electrical characteristic to each other, and then electric current is fed to the electrodes. Thus, the projection of the first conductive terminal is melted into and is welded to the weld surface of the second conductive terminal.

In the first conductive terminal, the step portion is formed at the position spaced away from the tip end position, and the entire tip end portion ranging from the tip end position to the step portion serves as the projection. Therefore, a nugget is formed in such a manner that the projection having a large area is melted into the second conductive terminal. Thus, it is possible to considerably spread an area of the nugget. As a result, it is possible to increase an electric current capacity of the nugget and to increase a tensile strength.

In the second conductive terminal, the weld surface has the size to cover the entire weld surface of the projection. In the welding, thus, electric current concentration occurs at an entire interface between a periphery of the projection and the weld surface. This denotes that the nugget is readily formed by the projection.

The respective conductive terminals (the first conductive terminal and the second conductive terminal) are molded such that the sectional area of the tip end portion of the first conductive terminal becomes substantially equal to the sectional area of the weld portion of the second conductive terminal. This leads to uniform distribution of electric current to be fed to the respective conductive terminals in the welding. As a result, a balance between heating values, that is, a heat balance can be made excellent. The heat balance is an important factor for stabilizing the formation of the nugget.

The first and second conductive terminals can be molded in such a manner that tinned copper plates are subjected to a cutting process and a bending process repeatedly.

Next, the projection of the first conductive terminal molded as described above is superimposed on the weld portion of the second conductive terminal. Then, the two conductive terminals are brought into contact under pressure with the electrodes, and welding current is fed to the electrodes. In order to make the heat balance excellent with certainty, herein, the two electrodes are preferably equal in electrical characteristic to each other. For example, each electrode is preferably a tungsten electrode.

By the feed of the welding current, the projection of the first conductive terminal is melted into and is welded to the weld surface of the second conductive terminal. More specifically, the electric current concentration occurs at the entire interface between the periphery of the projection and the weld surface of the second conductive terminal. As a result, the entire projection is melted into the weld surface of the second conductive terminal, and the nugget to be formed has a size corresponding to the area of the entire projection. Herein, a melting amount of the projection is restricted by the step portion. In other words, the projection is melted into the weld portion of the second conductive terminal by a length corresponding to the step portion. Therefore, it is possible to stabilize the size of the nugget. As a result, it is possible to stabilize the electric current capacity of the weld portion.

Herein, the respective conductive terminals are molded to satisfy relationships $L1<L2$ and $T1>T2$, in which $L1$ represents a width of the first conductive terminal, $L2$ represents a width of the second conductive terminal, $T1$ represents a thickness of the first conductive terminal and $T2$ represents a thickness of the second conductive terminal. When the shapes of the respective conductive terminals are set as described above, the entire projection of the first conductive terminal can be covered with the entire weld portion of the second conductive terminal. In addition, distribution of electric current to be fed to the respective conductive terminals becomes uniform; therefore, an excellent heat balance can be realized.

According to a modification of the present invention, the second conductive terminal is molded such that a step portion is formed at a position spaced away from a tip end position of the second conductive terminal and a projection is formed at a tip end portion ranging from the tip end position to the step portion. That is, the projection is formed on the second conductive terminal. Herein, the first conductive terminal is formed into a flat shape. In this configuration, a weld surface of the first conductive terminal is melted into and is welded to the projection of the second conductive terminal.

According to this configuration, similarly, electric current concentration occurs at an entire interface between the periphery of the weld surface of the first conductive terminal and the projection. As a result, the entire first conductive terminal is melted into the weld surface of the projection, and a nugget to be formed has a size corresponding to the area of the entire first conductive terminal. Herein, a melting amount of the first conductive terminal is restricted by the step portion. In other words, the first conductive terminal is melted into the weld portion of the projection by a length corresponding to the step portion. Therefore, it is possible to stabilize the size of the nugget. As a result, it is possible to stabilize the electric current capacity of the weld portion.

According to the present invention, it is possible to weld two conductive terminals each made of copper to each other with certainty, and to ensure an adequate welding strength for formation of a nugget having a large area.

BRIEF DESCRIPTION OF THE DRAWINGS

FIGS. 4A, 4B and 4C are a top view, a front view and a right side view each showing a state of attachment of the electrode;

DETAILED DESCRIPTION OF THE PREFERRED EMBODIMENTS

Figure 1:
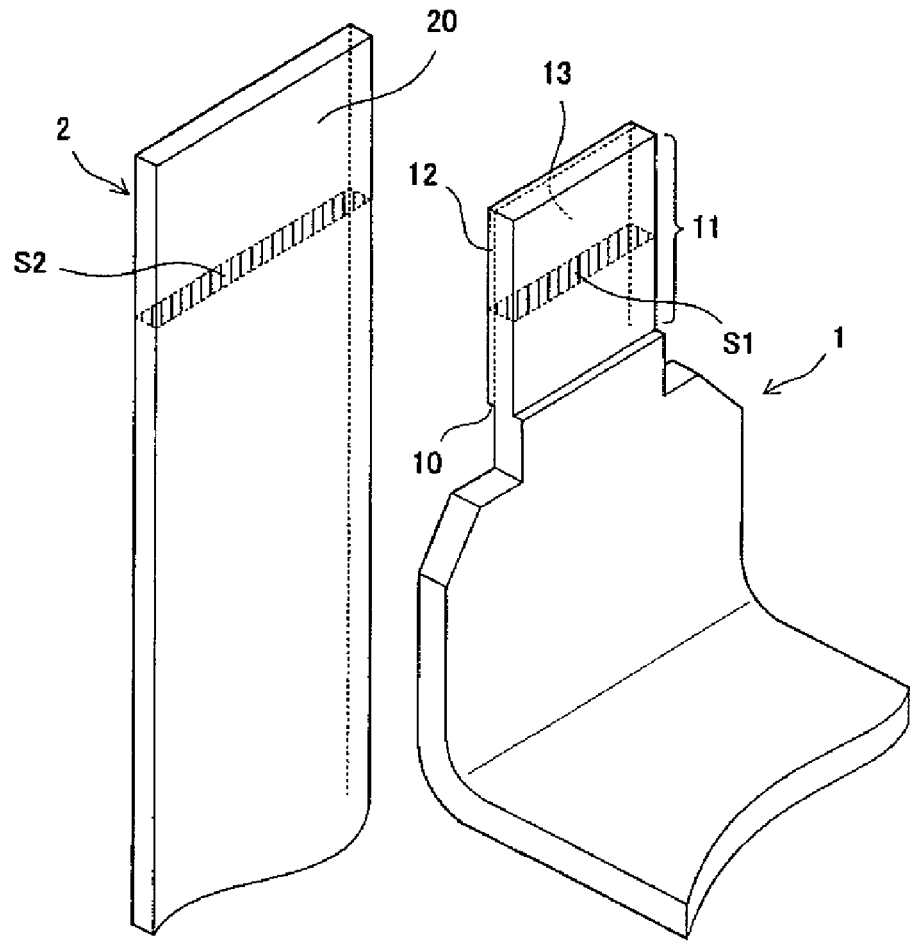
FIG. 1 shows conductive terminals according to one embodiment of the present invention.

FIG. 1 shows conductive terminals according to one embodiment of the present invention.

The first conductive terminal 1 and the second conductive terminal 2 are obtained as follows. That is, two tinned flat copper plates different in thickness from each other are subjected to a cutting process and a bending process repeatedly. Herein, the thickness is selected within a range from about 0.4 mm to about 0.9 mm. For example, the first conductive terminal 1 is made of a copper plate having a thickness of 0.64 mm, and the second conductive terminal 2 is made of a copper plate having a thickness of 0.4 mm.

First, the aforementioned copper plates each used as a starting base material are cut to obtain a flat-shaped conductive terminal having a width of 4.5 mm and a flat-shaped conductive terminal having a width of 5 mm. The conductive terminal having the width of 5 mm is made of the copper plate having the thickness of 0.64 mm and serves as the first conductive terminal 1. The conductive terminal having the width of 4.5 mm is made of the copper plate having the thickness of 0.4 mm and serves as the second conductive terminal 2. The first conductive terminal 1 and the second conductive terminal 2 are subjected to the cutting process and the bending process as follows.

(1) The first conductive terminal 1 is molded such that a step portion 10 is formed at a position spaced away from a tip end position of the first conductive terminal 1 and a projection 12 is formed at a tip end portion 11 ranging from the tip end position to the step portion 10. That is, the provision of the step portion 10 effects the formation of the projection 12 extending in a direction of the second conductive terminal 2 in FIG. 1. Thus, a weld surface (a surface opposite to the second conductive terminal 2 in FIG. 1) 13 of the projection 12 has an area equal to a size of the entire tip end portion 11. This molding is carried out in the bending process.

(2) The respective conductive terminals are molded such that a weld surface (a surface opposite to the first conductive terminal 1 in FIG. 1) 20 of the second conductive terminal 2 has a size to cover the entire weld surface 13 of the projection 12 of the first conductive terminal 1. More specifically, the two upper sides of the first conductive terminal 1 are cut; thus, the weld surface 20 of the second conductive terminal 2 is molded to have a size to cover the entire weld surface 13 of the projection 12 of the first conductive terminal 1. In the example shown in FIG. 1, the second conductive terminal 2 is already formed into a plate shape. Alternatively, the second conductive terminal 2 may be formed into the plate shape at this phase. Moreover, an amount of the copper plate to be cut for formation of the second conductive terminal 2 may be determined appropriately as necessary.

Figure 2:
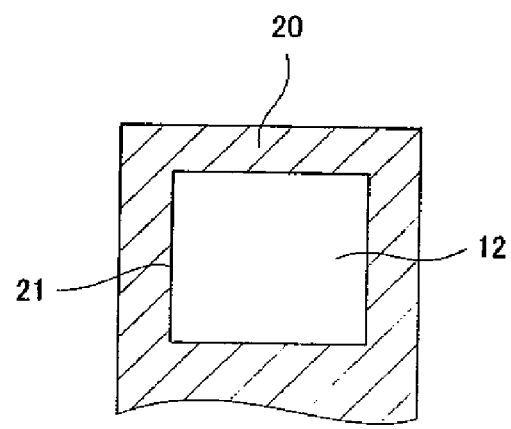
FIG. 2 shows a comparison between a size of a projection and a size of a weld surface of a second conductive terminal.

FIG. 2 shows a comparison between the size of the projection 12 and the size of the weld surface 20 of the second conductive terminal 2. As shown in FIG. 2, the weld surface 20 of the second conductive terminal 2 has a hatched region formed around the projection 12. As will be described later, this arrangement brings the following advantage. In welding, that is, electric current concentration occurs at an entire interface 21 between the periphery of the projection 12 and the weld surface 20. Thus, the entire projection 12 and part of the weld surface 20 opposite to the projection 12 are melted, so that a nugget (a melting portion) is formed.

(3) In the aforementioned process (2), the respective conductive terminals are molded such that a sectional area S1 of the tip end portion of the first conductive terminal 1 becomes substantially equal to a sectional area S2 of a weld portion of the second conductive terminal 2.

In the aforementioned process (2), the two upper sides of the first conductive terminal 1 are cut. Herein, a cut amount is set such that the sectional areas S1 and S2 become substantially equal to each other. In the example shown in FIG. 2, the second conductive terminal 2 is already formed into a plate shape. Alternatively, the second conductive terminal 2 may be formed into the plate shape at this phase. Moreover, an amount of the copper plate to be cut for formation of the second conductive terminal 2 may be determined appropriately as necessary.

When the sectional areas S1 and S2 are substantially equal to each other, distribution of electric current to be fed to the conductive terminals 1 and 2 in welding becomes uniform, so that a heating value of the first conductive terminal 1 becomes almost equal to that of the second conductive terminal 2. In other words, an excellent heat balance can be realized. The realization of the excellent heat balance can stabilize the formation of the nugget.

Figure 3:
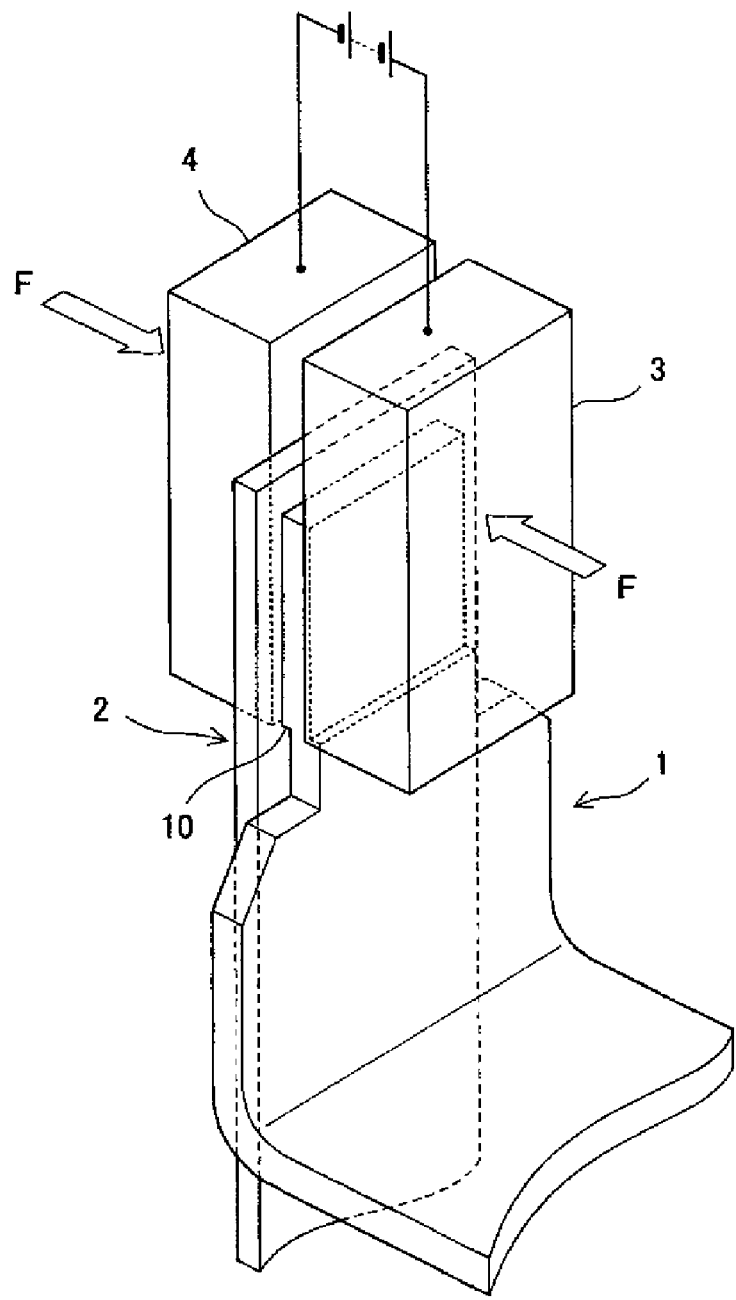
FIG. 3 shows a state where a first conductive terminal and the second conductive terminal are brought into contact under pressure with electrodes.

The projection surface of the first conductive terminal 1 and the weld surface 20 of the second conductive terminal 2, each of which is molded as described above, are brought into contact with each other. Further, electric current is fed to electrodes brought into contact under pressure with the two conductive terminals 1 and 2, respectively, so that the two surfaces are welded to each other. FIG. 3 shows a state where the first conductive terminal 1 and the second conductive terminal 2 are sandwiched between the electrodes 3 and 4. By application of pressure to the electrodes 3 and 4, the first conductive terminal 1 and the second conductive terminal 2 are brought into contact under pressure with each other. FIGS. 4A, 4B and 4C are a top view, a front view and a right side view each showing a state of attachment of the electrode. Each of the electrodes 3 and 4 is a rectangular electrode made of tungsten and has a single size. When the electrodes 3 and 4 are made of tungsten and are equal in size to each other, a more excellent heat balance can be realized.

As shown in FIGS. 4A to 4C, the electrode 3 has a size to cover the entire upper end portion 11 of the first conductive terminal 1. A pressure contact force F (see FIG. 3) is determined appropriately depending on the thickness and size of each of the conductive terminals 1 and 2, the amount of the electric current, and the like. Typically, the pressure contact force F is selected within a range from 15 kg to 25 kg. Preferably, the pressure contact force F is, for example, 16 kg. The amount of the electric current is selected within a range from 10 kA to 20 kA. An electric current feed time is selected within a range from 20 mm/s to 40 mm/s. Preferably, the electric current amount is, for example, 10 kA and the electric current feed time is, for example, 20 mm/s.

Figure 5A:
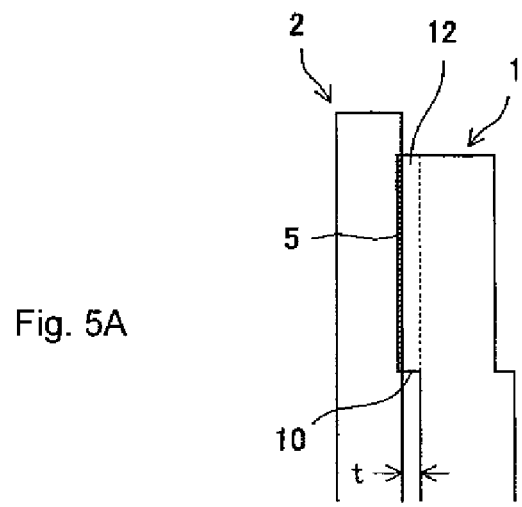
FIGS. 5A to 5C show a temporal change until formation of a nugget.
Figure 5B:
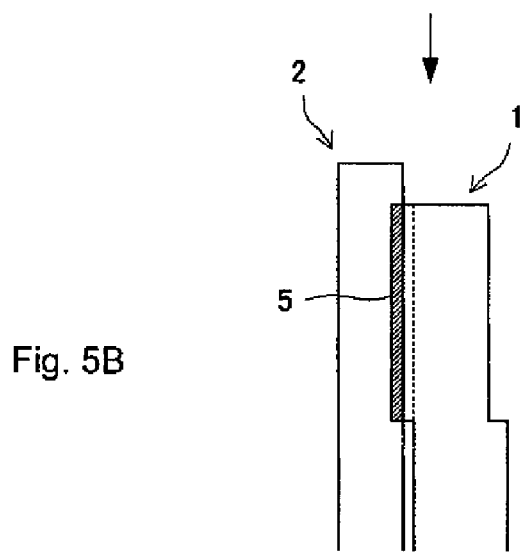
Figure 5C:
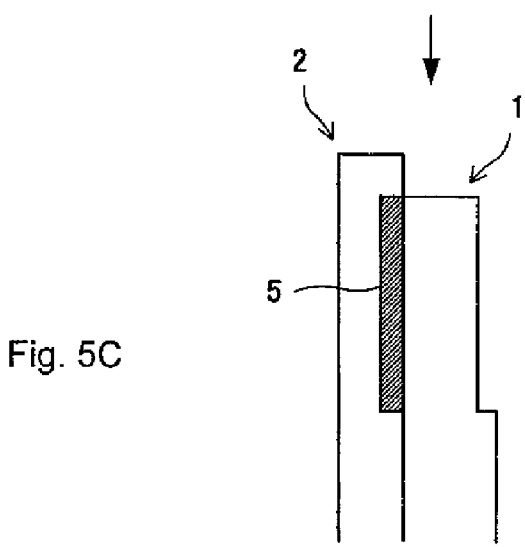

When the electric current is fed to the electrodes 3 and 4 for a predetermined period of time, the rectangular projection 12 in the tip end portion of the first conductive terminal 1 and the weld surface 20 of the second conductive terminal 2 are melted mutually to form the nugget having a size equal to the projection 12. FIGS. 5A to 5C show a temporal change upon formation of the nugget 5, respectively. Specifically, FIG. 5A shows an initial state in welding (in electric current feed), FIG. 5B shows an intermediate state, and FIG. 5C shows a final state. In the initial state where the electric current feed is started, the resistance of the tinned layer causes electric current concentration occurring at the entire interface between the periphery of the projection 12 and the weld surface 20 of the second conductive terminal 2. Thus, the projection 12 and weld surface 20 start to melt. As a result, the nugget 5 grows (FIG. 5A). In the intermediate state where the electric current is continuously fed, the projection 12 is further melted into the weld surface 20; thus, the nugget 5 becomes more larger (FIG. 5B). In the final state where the electric current is continuously fed, the projection 12 is completely melted into the weld surface 20; thus, the nugget 5 grows at maximum (FIG. 5C).

The final state corresponds to a state where a height t of the step portion 10 becomes zero, that is, a state where the first conductive terminal 1 and the second conductive terminal 2 come into contact with each other at a position below the step portion 10. In this state, the projection 12 is not melted into the weld surface 20 any more. Accordingly, a melting amount of the projection 12, that is, a maximum size of the grown nugget 5 is almost determined by the height t of the step portion 10.

With this behavior, the nugget 5 is formed in the weld surface 20. The area of the nugget 5 corresponds to the upper end portion 11 formed above the step portion 10. Therefore, it can be said that the area of the nugget 5 is considerably large. Thus, the welding strength between the two conductive terminals 1 and 2 can be adequately increased. Moreover, the melting amount of the projection 12 is restricted by the step portion 10. After completion of the welding, therefore, a space between the first conductive terminal 1 and the second conductive terminal 2 is substantially fixed at all times as shown in FIG. 5C.

Herein, FIGS. 5A to 5C schematically show the rectangular parallelepiped-shaped nugget 5. In actual, the interface of the nugget is unclear; therefore, irregularities may occur.

Experimental Example

The first conductive terminal 1 and the second conductive terminal 2 were made of copper plates each having a tinned layer formed thereon. Each of the copper plates has the following electrical characteristics.

Copper (resistivity; 1.72 μΩ·cm, conductivity: 100)
Tin (resistivity: 11.4 μΩ·cm, conductivity: 15.1)

Figures 6, 7:
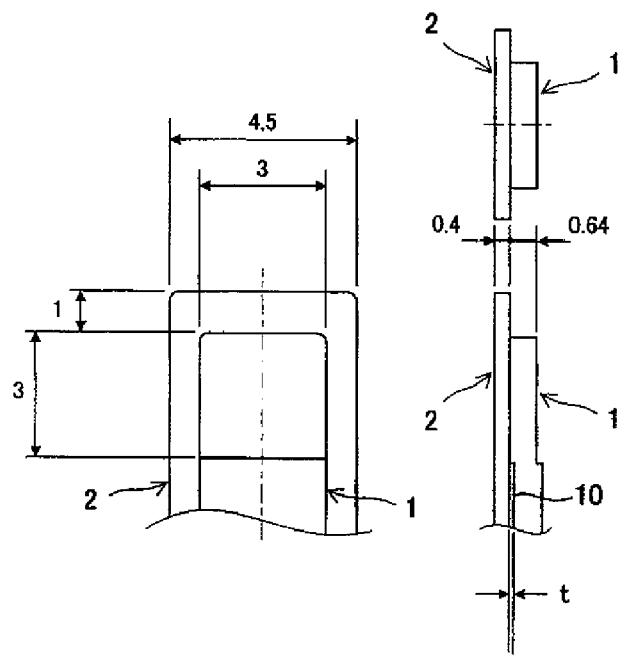
FIG. 6 shows shapes and dimensions of the conductive terminals for use in an experimental example of a welding method according to the present invention.
FIG. 7 is tables showing experimental results.

The first conductive terminal 1 and the second conductive terminal 2 were molded such that the shapes and dimensions thereof satisfy parameters shown in FIG. 6. In FIG. 6, numeric values are expressed in a unit of "mm". That is, the first conductive terminal 1 has a width L1 of 3 mm and a thickness T1 of 0.64 mm, and the second conductive terminal 2 has a width L2 of 4.5 mm and a thickness T2 of 0.4 mm. A relationship in width between the conductive terminals 1 and 2 is L1<L2, and a relationship in thickness between the conductive terminals 1 and 2 is T1>T2. Herein, the height t of the step portion 10 is 0.1 mm.

Herein, the sectional area of the tip end of the first conductive terminal 1 is calculated from a formula: 1.92 mm$^2$, and the sectional area of the tip end of the second conductive terminal 2 is calculated from a formula: 1.8 mm$^2$. The two sectional areas are substantially equal to each other.

The conductive terminals 1 and 2 are butted against each other, and then outer ends of the conductive terminals 1 and 2 are brought into contact under pressure with the tungsten electrodes (see FIG. 3). A pressurizing force herein was 16 kg. Moreover, an amount of electric current to be fed to the electrodes was 10 A, and a voltage hereat was 10 V.

FIG. 7 shows results of measurement about "the melting amount of the projection 12" and "the strength between the conductive terminals (the welding strength)" in a state where the electric current feed time is changed within a range from 20 ms to 40 ms under the aforementioned conditions in the welding. Herein, the former melting amount was measured in such a manner that the first and second conductive terminals 1 and 2 welded to each other by the welding are separated from each other. Moreover, the latter welding strength was measured as a tensile strength upon separation of the conductive terminals.

As shown in FIG. 7, the melting amount of the projection 12 became substantially equal to the height t (=0.1 mm) of the step portion 10 irrespective of the electric current feed time. Moreover, the strength between the conductive terminals was changed from 13.7 kg to 15.94 kg in accordance with the electric current feed time. At least, the strength had a value vastly exceeding 10 kg.

When the conductive terminals are separated from each other in a state where the strength between the conductive terminals has a value exceeding 10 kg, the base material of the conductive terminal is damaged. This implies that the conductive terminals are sufficiently welded to each other.

Figure 8:
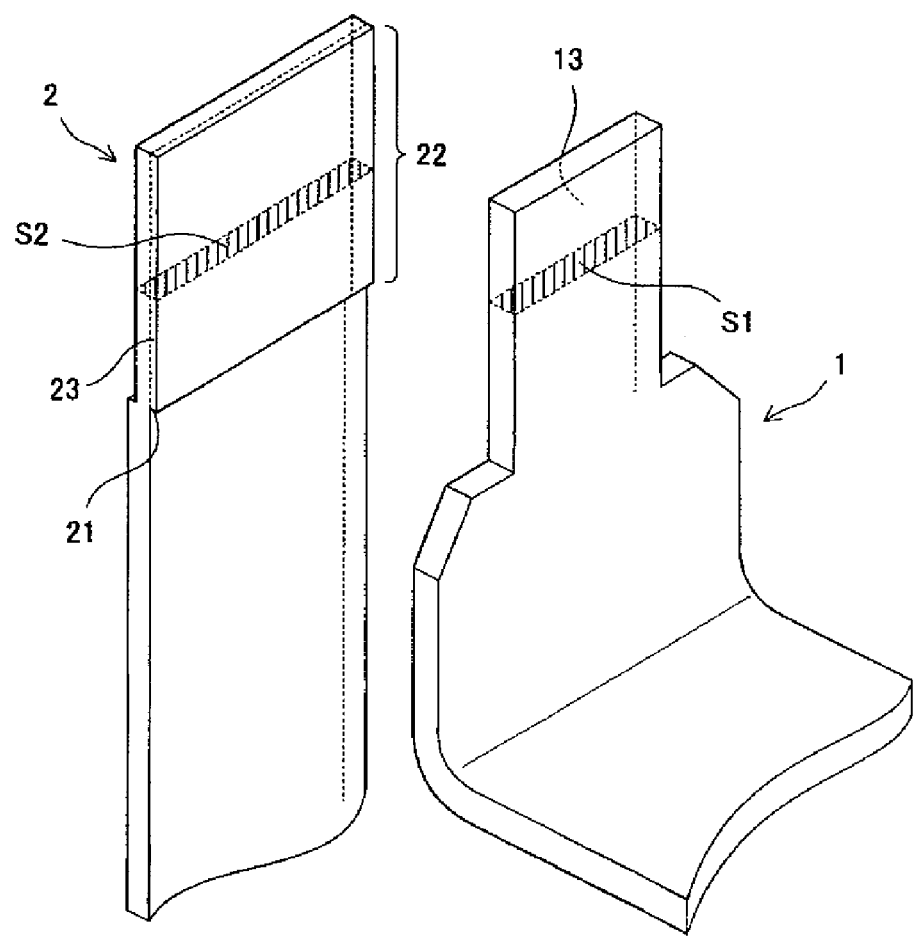
FIG. 8 shows conductive terminals according to another embodiment of the present invention.

FIG. 8 shows conductive terminals according to another embodiment of the present invention.

This embodiment is different from the previous embodiment in the shapes of the first and second conductive terminals 1 and 2. In this embodiment, that is, the first conductive terminal 1 includes no step portion 10, but the second conductive terminal 2 includes a step portion 21. Specifically, the respective conductive terminals have the following structures (4) to (7).

(4) The second conductive terminal 2 is molded such that the step portion 21 is formed at a position spaced away from a tip end position of the second conductive terminal 2 and a projection 23 is formed at a tip end portion ranging from the tip end position to the step portion 21.

(5) The respective conductive terminals 1 and 2 are molded such that a weld surface 13 of the first conductive terminal 1 has a size to be covered with the entire projection 23 of the second conductive terminal 2.

(6) The respective conductive terminals 1 and 2 are molded such that a sectional area S2 of the tip end portion 22 of the second conductive terminal 2 becomes substantially equal to a sectional area S1 of a weld portion of the first conductive terminal 1.

(7) The weld surface 13 of the first conductive terminal 1 is melted into and is welded to the projection 23 of the second conductive terminal 2.

As in the previous embodiment shown in FIG. 1, the first conductive terminal 1 is made of a copper plate having a thickness of 0.64 mm, and the second conductive terminal 2 is made of a copper plate having a thickness of 0.4 mm in this embodiment.

Figure 9A:
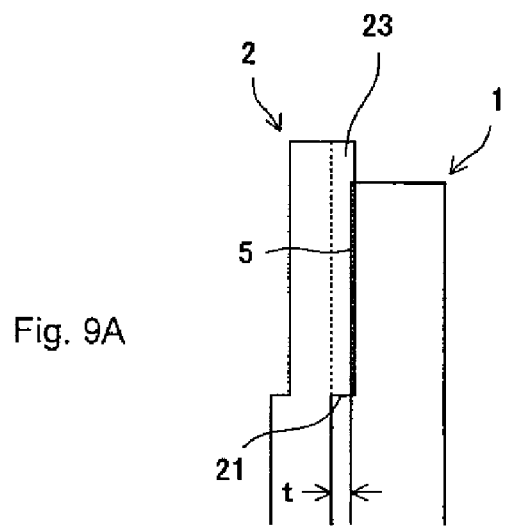
FIGS. 9A to 9C show a temporal change until formation of a nugget.
Figure 9B:
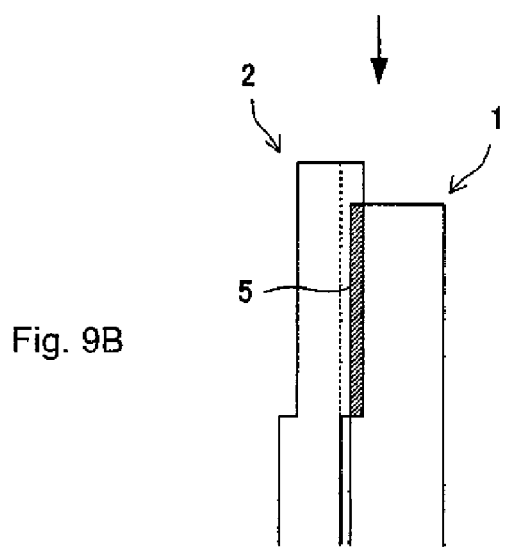
Figure 9C:
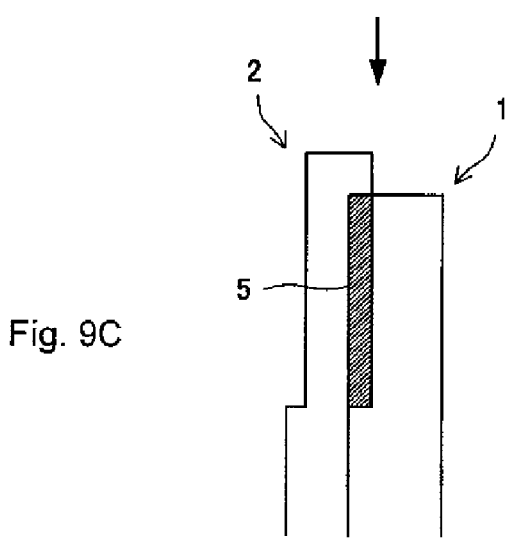

The welding of the conductive terminals 1 and 2 is performed as in the previous embodiment. FIGS. 9A to 9C show a temporal change upon formation of a nugget 5, respectively. Specifically, FIG. 9A shows an initial state in welding (in electric current feed), FIG. 9B shows an intermediate state, and FIG. 9C shows a final state. In the initial state where the electric current feed is started, resistance of a tinned layer causes electric current concentration occurring at an entire interface between the projection 23 and the weld surface 13 of the first conductive terminal 1. Thus, the projection 23 and weld surface 13 start to melt. As a result, the nugget 5 grows (FIG. 9A). In the intermediate state where the electric current is continuously fed, the weld surface 13 is further melted into the projection 23; thus, the nugget 5 becomes more larger (FIG. 9B). In the final state where the electric current is continuously fed, the weld surface 13 is completely melted into the projection 23; thus, the nugget 5 grows at maximum (FIG. 9C).

The final state corresponds to a state where a height t of the step portion 21 becomes zero, that is, a state where the first conductive terminal 1 and the second conductive terminal 2 come into contact with each other at a position below the step portion 21. In this state, the weld surface 13 is not melted into the projection 23 any more. Accordingly, a melting amount of the weld surface 13 into the projection 23, that is, a maximum size of the grown nugget 5 is almost determined by the height t of the step portion 21.

With this behavior, the nugget 5 is formed in the projection 23. The area of the nugget 5 corresponds to a portion above the first conductive terminal 1. Therefore, it can be said that the area of the nugget 5 is considerably large. Thus, the welding strength between the two conductive terminals 1 and 2 can be adequately increased. Moreover, the melting amount of the weld surface 13 of the first conductive terminal 1 into the projection 23 is restricted by the step portion 21. After completion of the welding, therefore, a space between the first conductive terminal 1 and the second conductive terminal 2 is substantially fixed at all times as shown in FIG. 9C.

In the embodiments shown in FIGS. 1 and 8, one of the first conductive terminal 1 and the second conductive terminal 2 includes the step portion and the projection. Alternatively, each of the two conductive terminals may include the step portion. With this configuration, similarly, the aforementioned nugget is formed at a portion where the two conductive terminals come into contact with each other.

Herein, the strength varies by the change in parameters such as the pressurizing force, the electric current value and the electric current feed time. In any cases, a phenomenon that "copper is welded" is observed.

The present invention can be applied to, for example, a control device for an electric power steering system (EPS). The control device has the following configuration. That is, the first conductive terminal and the second conductive terminal are attached to a substrate and a housing, respectively, and are welded to each other after assembly of the substrate and the housing. The present invention is particularly suitable for the device having the aforementioned characteristics.

Figure 10:
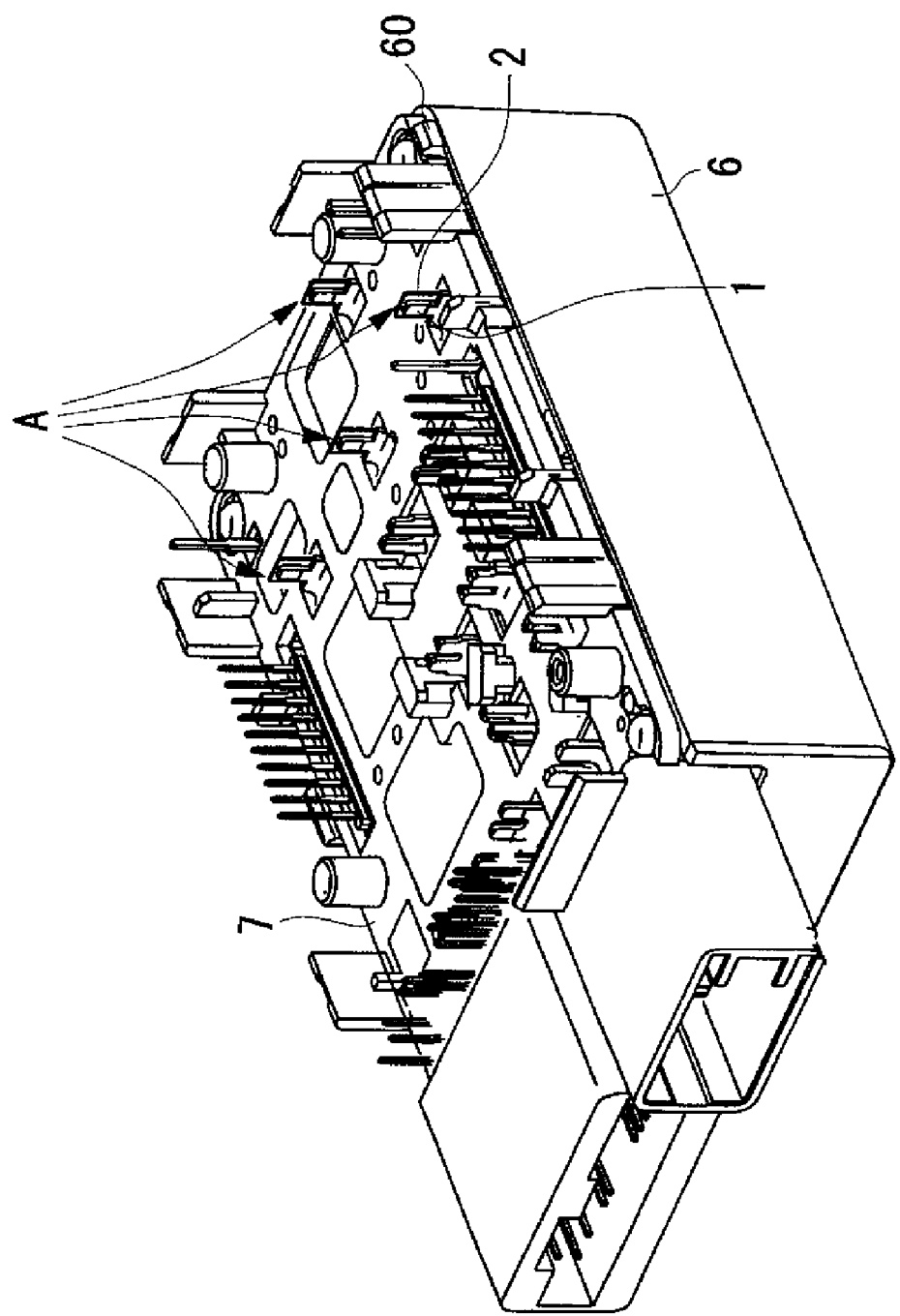
FIG. 10 shows a configuration of an electric power steering device to which the embodiment of the present invention is applied.

FIG. 10 shows the configuration of the EPS control device. In order to receive a large amount of electric current, the EPS control device adopts an aluminum housing 6 as the aforementioned housing from the viewpoint of high heat releasing performance. Then, a resin substrate 7 is attached to the aluminum housing 6 through an engagement portion 60 and the like; thus, the control device is configured. Although not shown in FIG. 10, further, an aluminum substrate is interposed between the resin substrate 7 and the aluminum housing 6, and electronic components such as a switching element, which rise in temperature upon activation, are mounted on the aluminum substrate.

In the aforementioned control device, the first conductive terminal 1 and the second conductive terminal 2 each made of copper are welded to each other at a portion indicated by a symbol "A" in FIG. 10. The first conductive terminal 1 and the second conductive terminal 2 are identical to those shown in FIGS. 1 to 3. One end of the second conductive terminal 2 is soldered to the aluminum substrate. Further, a lower end portion of the first conductive terminal 1 is attached to the resin substrate 7 by insert molding while being bent. When the resin substrate 7 is attached to the aluminum housing 6, the first conductive terminal 1 attached to the resin substrate 7 by insert molding and the second conductive terminal 2 soldered to the aluminum substrate provided in the aluminum housing 6 come into contact with each other at the portion indicated by the symbol "A" in FIG. 10. In this state, the two conductive terminals are welded to each other by resistance welding.

In this embodiment, the second conductive terminal 2 is soldered to the aluminum substrate provided in the aluminum housing 6 and the first conductive terminal 1 is attached to the substrate 7 by insert molding. As for an attaching strength, the former case is weaker than the latter case (that is, the soldering is weaker than the insert molding). Therefore, the thickness of the second conductive terminal 2 is smaller than the thickness of the first conductive terminal 1. With this configuration, even when an external force is applied to the second conductive terminal 2, the entire terminal becomes deformed plastically or deformed elastically. Thus, such an external force is alleviated. As a result, it is possible to prevent an external force from being applied to the soldered portion. On the other hand, the first conductive terminal 1 is attached by insert molding which is larger in attaching strength. Therefore, application of an external force exerts no influence on the electrical connection portion.

As described above, the present invention is usefully applied to an electronic device in which conductive terminals made of copper must be welded to each other after assembly of a substrate and a housing.

According to the present invention, as described above, it is possible to weld two conductive terminals each made of copper to each other by resistance welding with certainty and to ensure an adequate tensile strength for formation of a nugget having a large area.

What is claimed is:
1. A conductive terminal structure obtained by welding a first conductive terminal including a projection and made of a tinned flat copper plate and a second conductive terminal made of a tinned flat copper plate to each other by resistance welding,
the conductive terminal structure having the following features:
(1) the first conductive terminal is molded such that a step portion is formed at a position spaced away from a tip end position of the first conductive terminal and the projection is formed at a tip end portion ranging from the tip end position to the step portion;
(2) the first and second conductive terminals are molded such that a weld surface of the second conductive terminal has a size to cover the entire tip end portion of the first conductive terminal;
(3) the first and second conductive terminals are molded such that the tip end portion of the first conductive terminal has a sectional area substantially equal to a sectional area of a weld portion of the second conductive terminal; and
(4) the projection of the first conductive terminal is melted into and is welded to the weld surface of the second conductive terminal.

2. The conductive terminal structure according to claim 1, wherein
in the features (2) and (3), the first and second conductive terminals are molded to satisfy relationships $L1<L2$ and $T1>T2$, in which $L1$ represents a width of the first conductive terminal, $L2$ represents a width of the second conductive terminal, $T1$ represents a thickness of the first conductive terminal and $T2$ represents a thickness of the second conductive terminal.

3. A conductive terminal structure obtained by welding a first conductive terminal made of a tinned flat copper plate and a second conductive terminal including a projection and made of a tinned flat copper plate to each other by resistance welding,
the conductive terminal structure having the following features:
(1) the second conductive terminal is molded such that a step portion is formed at a position spaced away from a tip end position of the second conductive terminal and the projection is formed at a tip end portion ranging from the tip end position to the step portion;
(2) the first and second conductive terminals are molded such that a weld surface of the first conductive terminal has a size to be covered with the entire projection of the second conductive terminal;
(3) the first and second conductive terminals are molded such that the tip end portion of the second conductive terminal has a sectional area substantially equal to a sectional area of a weld portion of the first conductive terminal; and
(4) the weld surface of the first conductive terminal is melted into and is welded to the projection of the second conductive terminal.

4. The conductive terminal structure according to claim 3, wherein
in the features (2) and (3), the first and second conductive terminals are molded to satisfy relationships $L1<L2$ and $T1>T2$, in which $L1$ represents a width of the first conductive terminal, $L2$ represents a width of the second conductive terminal, $T1$ represents a thickness of the first conductive terminal and $T2$ represents a thickness of the second conductive terminal.

5. A method for welding a first conductive terminal including a projection and a flat-shaped second conductive terminal to each other by resistance welding, the method comprising the steps of:
bringing a first conductive terminal made of a tinned flat copper plate, wherein a step portion is formed at a position spaced away from a tip end position of the first conductive terminal and a projection is formed at a tip end portion ranging from the tip end position to the step portion, into contact with a second conductive terminal made of a tinned flat copper plate, wherein a weld surface has a size to cover the entire tip end portion of the first conductive terminal and a weld portion has a sectional area substantially equal to a sectional area of the tip end portion of the first conductive terminal, bringing the first and second conductive terminals into contact under pressure with electrodes equal in electrical characteristic to each other;

feeding electric current to the electrodes; and welding the projection of the first conductive terminal to the weld surface of the second conductive terminal in such a manner that the projection is melted into the weld surface.

6. The method according to claim 5, wherein the first and second conductive terminals satisfy relationships L1<L2 and T1>T2, in which L1 represents a width of the first conductive terminal, L2 represents a width of the second conductive terminal, T1 represents a thickness of the first conductive terminal and T2 represents a thickness of the second conductive terminal.

7. The method according to claim 5, wherein the electrode is a tungsten electrode.

8. A method for welding a flat-shaped first conductive terminal and a second conductive terminal including a projection to each other by resistance welding, the method comprising the steps of:

bringing a second conductive terminal made of a tinned flat copper plate, wherein a step portion is formed at a position spaced away from a tip end position of the second conductive terminal and a projection is formed at a tip end portion ranging from the tip end position to the step portion, into contact with a first conductive terminal made of a tinned flat copper plate, wherein a weld surface has a size to be covered with the entire tip end portion of the second conductive terminal and a weld portion has a sectional area substantially equal to a sectional area of the tip end portion of the second conductive terminal;

bringing the first and second conductive terminals into contact under pressure with electrodes equal in electrical characteristic to each other;

feeding electric current to the electrodes; and welding the weld surface of the first conductive terminal to the projection of the second conductive terminal in such a manner that the weld surface is melted into the projection.

9. The method according to claim 8, wherein the first and second conductive terminals satisfy relationships L1<L2 and T1>T2, in which L1 represents a width of the first conductive terminal, L2 represents a width of the second conductive terminal, T1 represents a thickness of the first conductive terminal and T2 represents a thickness of the second conductive terminal.

10. The method according to claim 8, wherein the electrode is a tungsten electrode.

* * * * *